(12) United States Patent
Cischke et al.

(10) Patent No.: US 7,458,043 B1
(45) Date of Patent: Nov. 25, 2008

(54) GENERATION OF TESTS USED IN SIMULATING AN ELECTRONIC CIRCUIT DESIGN

(75) Inventors: Christopher M. Cischke, Houghton, MI (US); Ashley K. Wise, Blaine, MN (US)

(73) Assignee: Unisys Corporation, Blue Bell, PA (US)

( * ) Notice: Subject to any disclaimer, the term of this patent is extended or adjusted under 35 U.S.C. 154(b) by 603 days.

(21) Appl. No.: 11/227,548

(22) Filed: Sep. 15, 2005

(51) Int. Cl.
*G06F 17/50* (2006.01)
*G06F 9/45* (2006.01)

(52) U.S. Cl. .............................. 716/3; 703/22; 717/136
(58) Field of Classification Search .................... 716/1, 716/3, 18, 19; 703/22; 717/104, 106, 122, 717/124, 135, 136
See application file for complete search history.

(56) References Cited

U.S. PATENT DOCUMENTS

| | | | | |
|---|---|---|---|---|
| 6,125,402 | A * | 9/2000 | Nagarajayya et al. | 719/330 |
| 6,629,310 | B1 * | 9/2003 | Wong-Lam et al. | 716/17 |
| 6,701,514 | B1 * | 3/2004 | Haswell et al. | 717/115 |
| 7,017,162 | B2 * | 3/2006 | Smith et al. | 719/328 |
| 7,197,417 | B2 * | 3/2007 | Pramanick et al. | 702/119 |
| 7,209,851 | B2 * | 4/2007 | Singh et al. | 702/119 |
| 7,310,594 | B1 * | 12/2007 | Ganesan et al. | 703/13 |
| 7,386,434 | B1 * | 6/2008 | Cischke | 703/14 |
| 2003/0033498 | A1 * | 2/2003 | Borman et al. | 711/206 |
| 2003/0097360 | A1 * | 5/2003 | McGuire et al. | 707/8 |
| 2006/0117274 | A1 * | 6/2006 | Tseng et al. | 716/1 |
| 2007/0083726 | A1 * | 4/2007 | Newton et al. | 711/170 |
| 2008/0120624 | A1 * | 5/2008 | Borman et al. | 719/316 |

* cited by examiner

*Primary Examiner*—Stacy A Whitmore
(74) *Attorney, Agent, or Firm*—Charles A. Johnson; Robert Marley; Crawford Maunu PLLC

(57) ABSTRACT

Various approaches for generating input data for simulating a circuit design are disclosed. In one approach, a test generator program is generated from a main program that uses a test generator class library. The test generator class library includes a software driver class corresponding to the hardware driver, and the software driver class includes a storage class corresponding to each memory within the hardware driver, a first set including at least one method for writing function codes to a first object of the storage class, and a second set including at least one method for writing data to a second object of the storage class. Function codes are written to the first object of the storage class in response to a call by the test generator program to a method in the first set. Data of a first type is written to the second object of the storage class in response to a call by the test generator program to a method in the second set, wherein the data of the first type is data to be provided by the driver as input to the simulated circuit design.

12 Claims, 6 Drawing Sheets

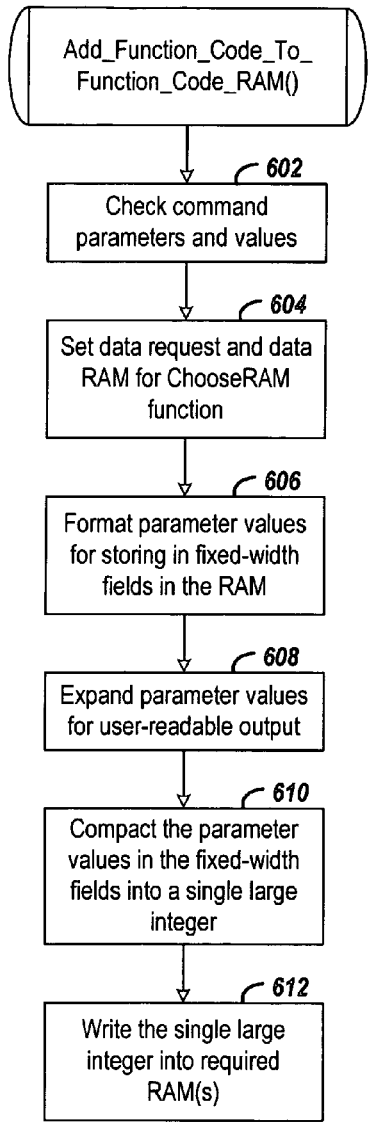
FIG. 6
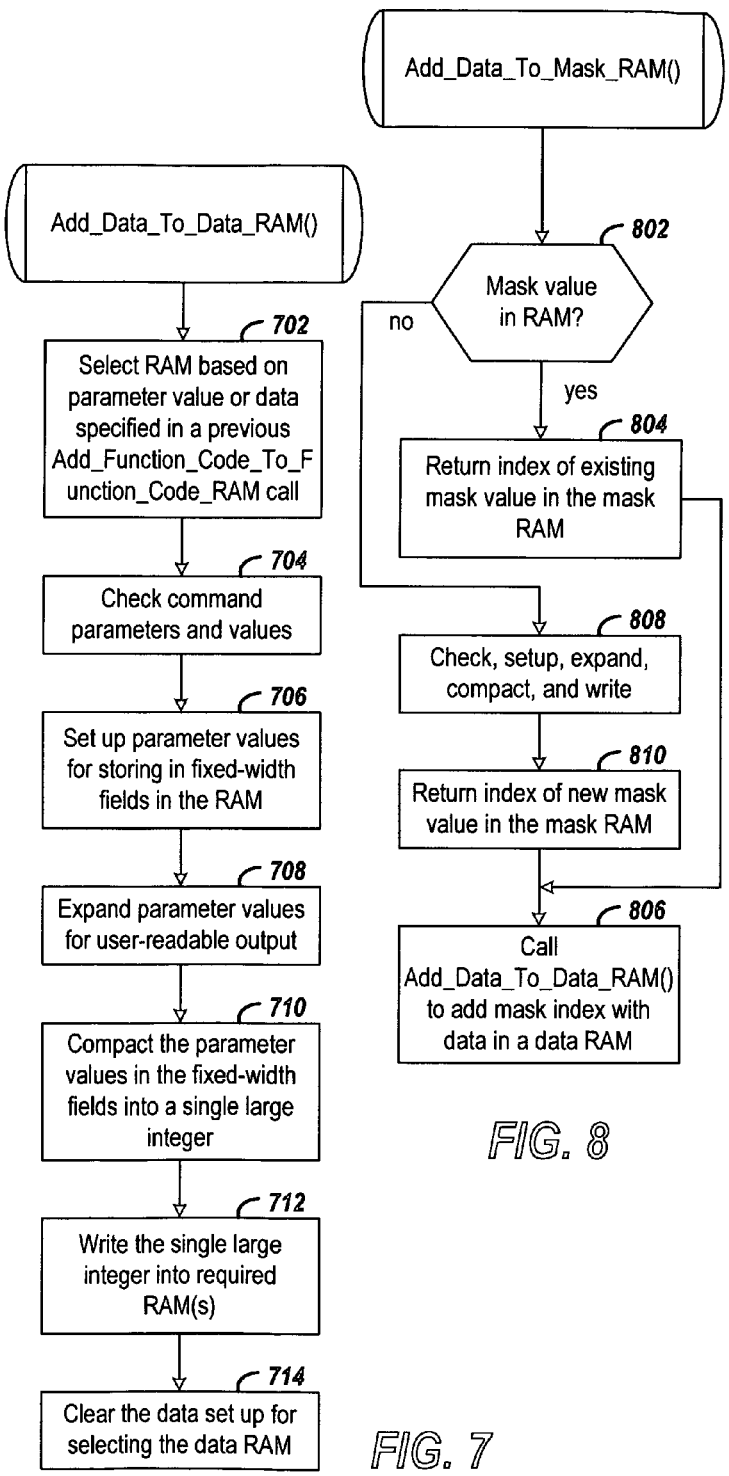
FIG. 7
FIG. 8

US 7,458,043 B1

GENERATION OF TESTS USED IN SIMULATING AN ELECTRONIC CIRCUIT DESIGN

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present disclosure relates to generating test programs for loading into a port driver to drive input to a simulated electronic circuit design and verify output.

BACKGROUND OF THE INVENTION

Modern integrated circuits may have millions of transistors or "gates" created on monolithic substrates of silicon. These circuits, perhaps two tenths of an inch square, are quite complex in their internal organization. This complexity makes it difficult to test whether they are functioning properly in accordance with their design, and also whether the design itself was without errors. Early testing of the design on integrated circuit simulators is quite important, since the cost of having to correct a flawed design after the integrated circuit is already being manufactured can be extremely high.

For this reason, integrated circuit designs are put through a rigorous design testing process before the circuits are manufactured. This process is called "design verification" and it is performed in software or hardware simulators that are configured to imitate the operation of the integrated circuit.

Each succeeding generation of integrated circuits poses new design verification problems. Following Moore's law, design complexity is doubling every 12-18 months, which causes design verification complexity to increase at an exponential rate. In addition, competitive pressures increasingly demand shorter time to market. The combination of these forces has caused an ever worsening "verification crisis".

Simulation-based functional verification is a popular method of functional verification, and is widely used within the digital design industry as a method for finding defects within designs. A variety of products are available in the market to support simulation-based verification methodologies. However, a fundamental problem with conventional simulation-based verification approaches is that they are slow and often do not uncover all design errors due to the unavoidable shallowness of the tests and the limited time available to run simulations.

One way for testing a design is with the use of testbench modules that are designed into the design under test using a hardware description language (HDL), for example. The testbench modules drive the input ports of the hardware and check output values. However, since the testbench modules are hardcoded into the design, changing the testbench would require rebuilding the entire design under test. For a large design, the time required may be considerable.

Another way to test a design is to create waveforms (a timed list of input signals to the design) and drive these input signals during simulation at the appropriate times. The waveforms may be changed without rebuilding the design. However, comparing actual output to expected output using waveforms may be difficult because the output signals may have to be precisely timed, which may be difficult during simulation.

A method and system that address these and other related issues are therefore desirable.

SUMMARY OF THE INVENTION

The invention provides various embodiments for generating input data for simulating a circuit design. In one approach, a test generator program is generated from a main program that uses a test generator class library. The test generator class library includes a software driver class corresponding to the hardware driver, and the software driver class includes a storage class corresponding to each memory within the hardware driver, a first set including at least one method for writing function codes to a first object of the storage class, and a second set including at least one method for writing data to a second object of the storage class. Function codes are written to the first object of the storage class in response to a call by the test generator program to a method in the first set. Data of a first type is written to the second object of the storage class in response to a call by the test generator program to a method in the second set, wherein the data of the first type is data to be provided by the driver as input to the simulated circuit design.

In another embodiment, a system is provided for generating input data to a first hardware driver that drives a first set of inputs of a simulated electronic circuit design. The system includes first, second, and third addressable storage objects that are readable by the first hardware driver. A test generator is coupled to the first, second, and third storage objects and includes a first driver object configured to write function codes to the first storage object. The first driver object is further configured to write data of a first type to the second storage object. The data of the first type is data to be provided by the first hardware driver as input to the simulated circuit design. A second driver object is configured to write mask data to the third storage object. Each unit of mask data specifies one or more parts of a unit of data to be used for comparison to a unit of data received by the first hardware driver from the simulated circuit design.

In another embodiment, a system includes means for translating a programmatic specification of functions to be performed by the hardware driver into function codes to be input to the hardware driver; means for translating a programmatic specification of input data for the hardware driver into a first format recognized by the hardware driver; means for translating a programmatic specification of mask values into a second format recognized by the hardware driver; means for storing the function codes; means for storing the input data of the first format; and means for storing the mask values in the second format.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Other aspects and advantages of the invention will become apparent upon review of the Detailed Description and upon reference to the drawings in which:

FIG. 6 is a flow diagram of an example process for adding function codes to a function-code RAM in accordance with various embodiments of the invention;

FIG. 7 is a flow diagram of an example function for adding data to a data RAM in accordance with various embodiments of the invention; and FIG. 8 is a flow diagram of an example function for adding data to a mask RAM in accordance with various embodiments of the invention.

DETAILED DESCRIPTION

Figure 1:
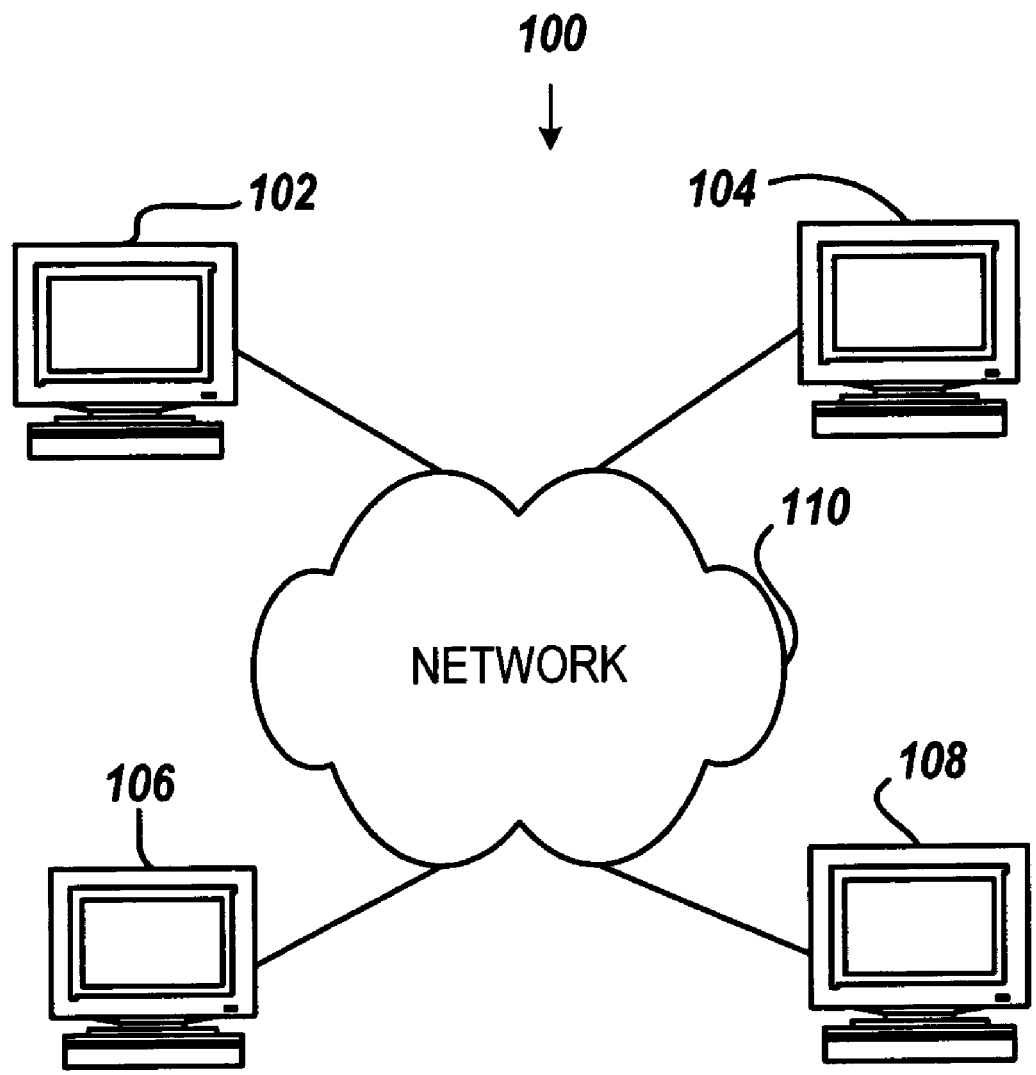
FIG. 1 illustrates a functional verification system in which one or more embodiments of the present invention may be implemented.

Before describing an illustrative design verification environment in which various embodiments of the present invention may be implemented, brief definitions of terms used throughout this application are given below.

A "design" is defined as a description of a collection of objects, such as modules, blocks, wires, registers, and components that represent elements of a logic circuit.

A design may be expressed in the form of a language. For example, a hardware description language (HDL), such as Verilog or VHDL can be used to describe the behavior of hardware as well as its implementation.

As used herein, "simulation" is defined as the process of evaluating design behavior for a set of input conditions to draw approximate conclusions about the behavior of many different attributes of the design.

"Hardware simulator" is defined as a simulator in which the operation of the design under test is programmed into many integrated circuits called "gate arrays", which imitate the interactive operation of individual circuits in the design. The advantage of performing hardware simulations on a hardware simulator is that multiple programmed gate arrays can change state simultaneously, speeding up the simulation process.

"Software simulator" is defined as a simulator in which the simulation of the operation of the design under test is provided by a general purpose computer having one or more central processing units that are programmed to calculate state transitions for the individual circuits (or predefined collections of circuits) of the design. The disadvantage of software simulations and software simulators is that every state transition of a circuit must be individually calculated by a limited number of central processing units.

"Functional verification" is defined as the process of applying stimuli to a design under test with appropriate checking mechanisms to either detect a defect in the design or to establish that the functionality performs as expected. Typically, the three key components of a functional verification process are the applied stimulus, the checking mechanism, and the user's ability to both run the process and debug the results.

A "function" is defined as a command given to a hardware or software simulator to direct the simulator to perform a predetermined activity. A function has a description, and may have one or more parameters associated with it.

A "normal function" is defined as a function that the simulator treats as an input to stimulate the simulated portion of the integrated circuit. For example, an actual cache memory device has a command set to which it responds. Such commands sets typically include (as just one example) a command to write a specific value to a specific cache memory location. In this instance, the description of the function is a "write" command, and the parameters would be (1) the address of the memory location to be written to, and (2) the data to be written to the location. Commands that either read to or write from the simulated main memory of a computer are examples of normal functions.

A "control function" is defined as all functions other than "normal functions". For example, commands may be passed to the hardware driver to tell it how to behave, or to tell it to do something special with the subsequent normal function.

A "test source file" or "test file" is defined as a file containing a sequence of functions or tests to be applied by a simulator to a simulated integrated circuit. It is typically in plain-text for human review and may be (although need not be) compiled into a more compact form for execution by a simulator.

The "set address" portion of a memory address is the portion that the cache uses to determine the particular set of cache locations that might contain the desired block of data. The length of the "set address" portion will vary depending upon the size of the cache.

A "tag address" is a sub-address used by the cache to identify particular cache memory locations within a particular set of memory blocks in the cache memory.

"Commodity I/O" refers to data input and output between the processor and devices other than main memory. Commodity I/O may include, for example, communications between the processor and special subsystems such as user input devices (e.g. keyboards and mice), data acquisition devices, data card readers and video display adapters. Commodity I/O read commands have different opcodes from regular (or "normal") memory read commands. Most caches are configured to identify these different command codes and process Commodity I/O reads and writes differently than normal read and write commands.

"Bit-wise writes" or "per-J writes" refer to processor write functions that write directly to sub-portions or "bits" of words rather than to entire words. Bit-wise writes therefore change the contents of portions of a memory location word, but not the entire word itself.

"Leaky writes" refer to processor write functions that force the cache to write data to main memory sooner than it would under other circumstances. In the preferred embodiment, a "leaky write" is a processor write function that has a special control bit that can be set. This control bit indicates to the cache that the data in the write function should be written out sooner than the cache would if it used its normal data aging process. As a result, by issuing a leaky write command, the processor is configured to avoid the cache's normal data aging processes and write data to main memory as soon as reasonably possible.

A "prefetch write" is a command that a processor sends to its associated cache device. This command directs the cache to assert "ownership" of the memory location in the prefetch write command. A processor makes prefetch write commands in advance of the processor writing data to that main memory location to insure that the memory location will be available for writing when the processor later needs to write to that location.

A "read with lock" function simultaneously reads a main memory location and locks that location (and the adjacent locations comprising the 8-16 word cache line fetched by the read-with-lock function). In the example provided herein, this memory lock is released by (1) accessing (either by reading from or writing to) any of the 8-16 words of the cache line fetched by the read-with-lock function, and (2) subsequently issuing a lock release function to the specific memory location previously locked.

FIG. 1 illustrates a functional verification system 100 in which one or more embodiments of the present invention may be implemented. System 100 is preferably comprised of several computers 102, 104, 106, and 108 that are coupled together over a network 110. While system 100 is preferably distributed in this manner, it may be implemented on one or more computers having the capabilities described below.

Computer 102 may be configured as a test development workstation for generating various port driver objects for testing an integrated circuit design. In one embodiment, computer 102 may be a general purpose computer running a general purpose operating system. Computer 104 may be configured to simulate the integrated circuit design under test by running a simulation program. For example, a workstation suitably configured to run a simulator compatible with the desired testing may be used. Computer 106 may be configured in combination with other hardware to simulate (in hardware) a portion of the circuit design under test. Computer 108 may be configured to archive data and programs that are on the test development workstation.

Network 110 couples each of computers 102, 104, 106, and 108 and may include modems, routers, hubs and gateways as needed. The network may be configured to include a LAN or a WAN. It may also include a public packet switched network, such as the Internet, for example.

Figure 2:
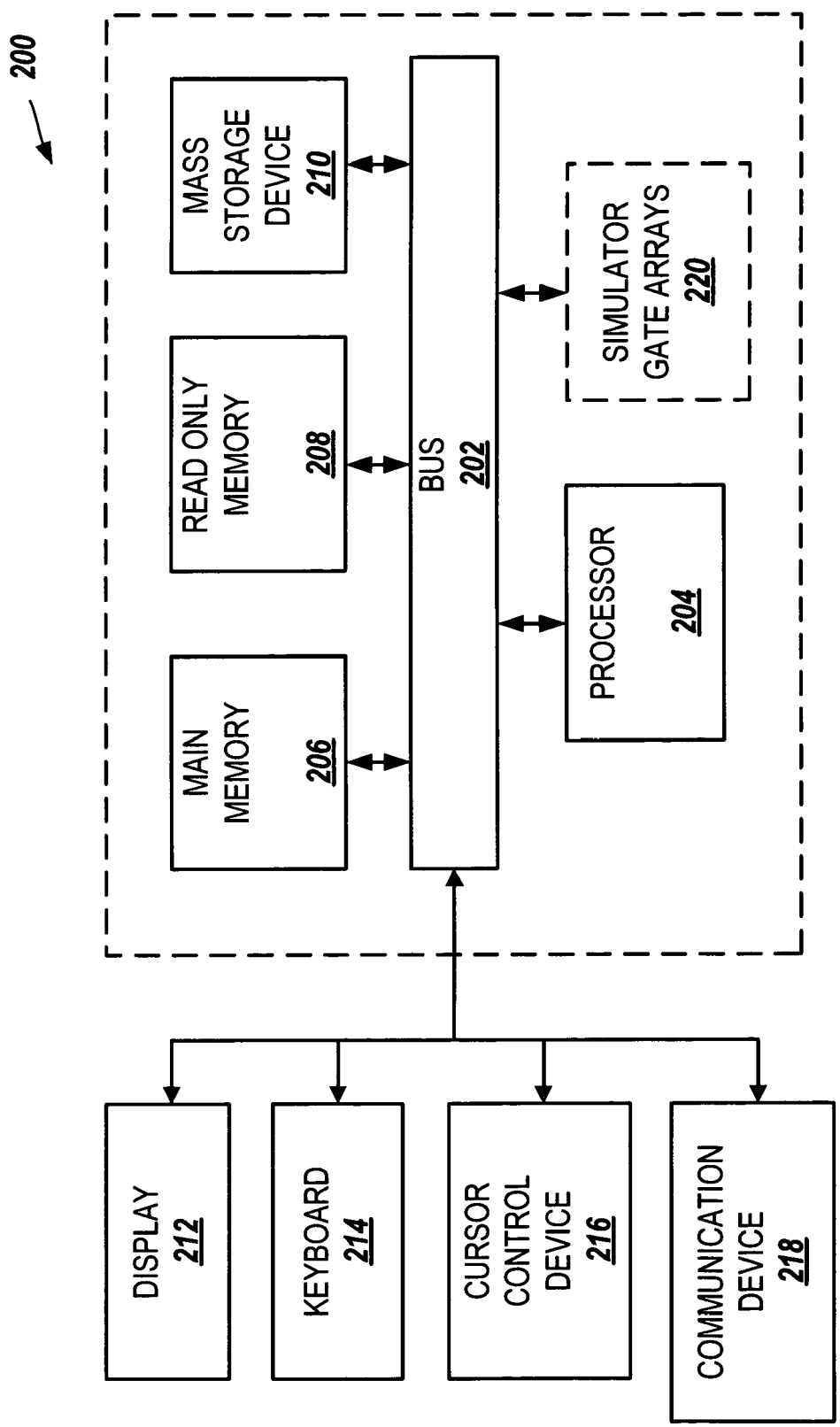
FIG. 2 illustrates architectural details of an example computer that may be used for any of the computers FIG. 1.

FIG. 2 illustrates architectural details of an example computer 200 that may be used for any of computers 102, 104, 106, and 108 of FIG. 1. Computer system 200 comprises a bus or other communication means 202 for communicating information, and a processing means, such as processor 204, coupled with bus 202 for processing information. Computer system 200 further comprises a random access memory (RAM) or other dynamic storage device 206 (referred to as main memory), coupled to bus 202 for storing information and instructions to be executed by processor 204. Main memory 206 also may be used for storing temporary variables or other intermediate information during execution of instructions by processor 204. Computer system 200 also comprises a read only memory (ROM) and/or other static storage device 208 coupled to bus 202 for storing static information and instructions for processor 204.

A mass storage device 210, such as a magnetic disk or optical disk and corresponding drives, may also be coupled to computer system 200 for storing information and instructions. Computer system 200 can also be coupled via bus 202 to a display device 212, such as a cathode ray tube (CRT) or Liquid Crystal Display (LCD), for displaying information to an end user. For example, graphical and/or textual depictions/indications of design errors, and other data types and information may be presented to the end user on the display device 212. Typically, an alphanumeric input device 214 (e.g., a keyboard), including alphanumeric and other keys, may be coupled to bus 202 for communicating information and/or command selections to processor 204. Another type of user input device is cursor control 216, such as a mouse, a trackball, or cursor direction keys for communicating direction information and command selections to processor 204 and for controlling cursor movement on display 212.

A communication device 218 is also coupled to bus 202. Depending upon the particular design environment implementation, the communication device 218 may include a modem, a network interface card, or other well-known interface devices (not shown), such as those used for coupling to Ethernet, token ring, or other types of physical attachment for purposes of providing a communication link to support a local or wide area network, for example. In any event, in this manner, the computer system 200 may be coupled to a number of clients and/or servers via a conventional network infrastructure, such as a company's Intranet and/or the Internet, for example.

When used as hardware simulation computer 106, a computer like computer 200 also includes simulator programmable gate arrays 220 that are programmed by processor 204 to simulate the integrated circuit design.

Figure 3:
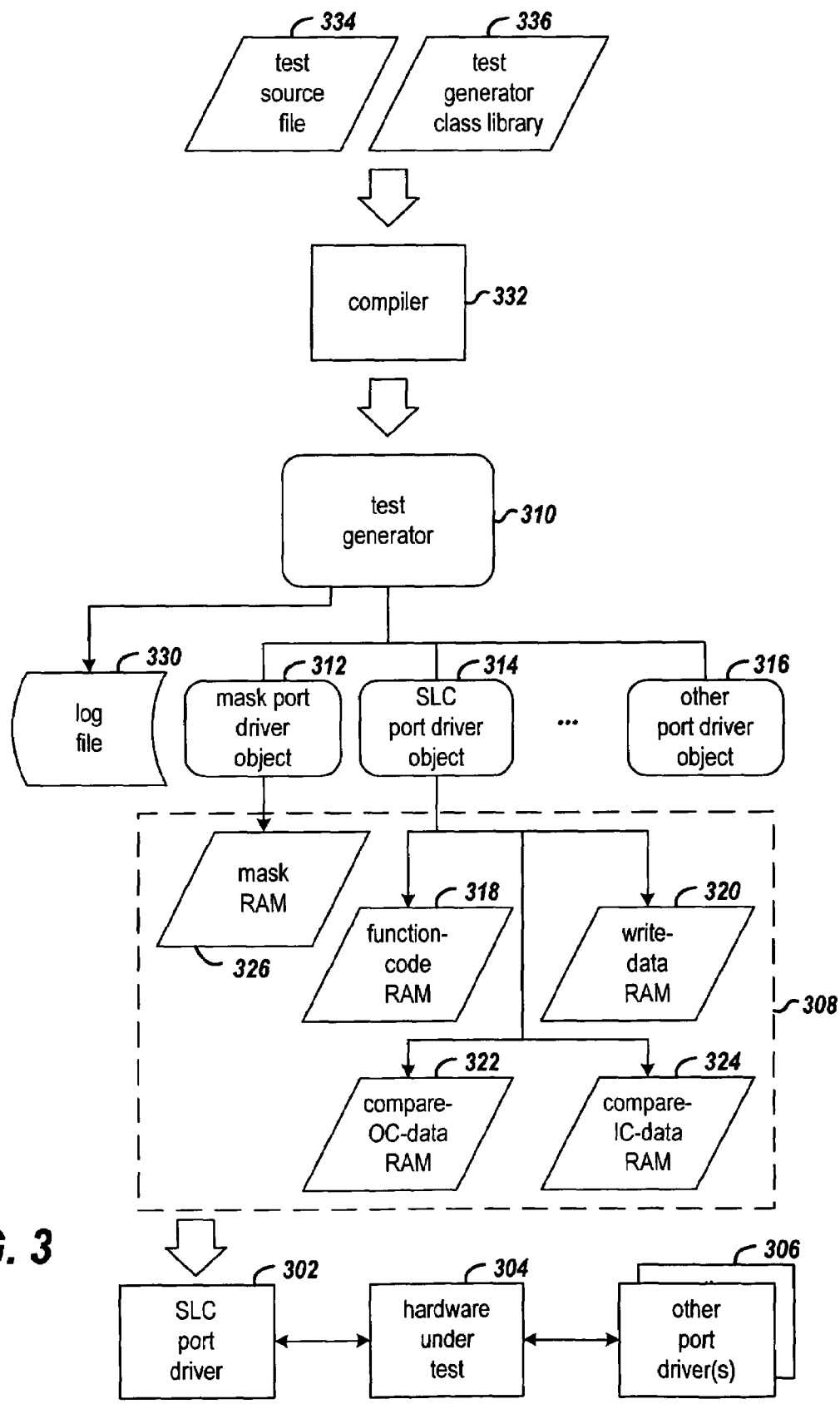
FIG. 3 is a flow diagram that illustrates components used to generate test data for use in simulating a circuit design in accordance with various embodiments of the invention.

FIG. 3 is a flow diagram that illustrates components used to generate test data for use in simulating a circuit design in accordance with various embodiments of the invention. In the example embodiment, a program is executed to generate the test data. The test data includes function codes and data used during simulation. The function codes are decoded and the corresponding functions performed by a port driver, which also drives input data to the simulated circuit under test. By programmatically defining the test data that is to be generated and executing a program to generate the test data, the many repetitive sections of a test may be easily generated. For example, the test data may include program loops and branches which are interpreted by the port driver in driving and verifying the simulated circuit under test. The flow illustrated in FIG. 3 thereby shows an approach by which the function codes, input data, and mask data may be programmatically specified and effectively translated into the required format for processing and input to the simulated circuit under test.

For purposes of explaining how the example embodiments relate to simulation of an electronic circuit design, the description of FIG. 3 begins at the input to the simulated circuit design. The test data is prepared for input to a port driver, for example port driver 302, which drives the ports of the hardware under test 304. In the example illustrated by the flow diagram, the hardware under test includes a second level cache (SLC). Those skilled in the art will recognize that tests for other types of systems or subsystems may be generated using the teachings of the present invention. Other port drivers 306, for example, may be used in combination with the SLC port driver 302 to test other subsystems of a computer system design.

A port driver, such as port driver 302, reads from the collection of RAMs 308. The data in RAMS 308 designate functions to be performed by the port driver, data to be input to the hardware under test, and data used in verifying correct operation of the hardware under test. In one embodiment, the function codes and data are established in separate RAM objects by objects of the test generator program 310.

The example test generator program 310 includes a mask port driver object 312, an SLC port driver object 314, and other port driver objects 316 that generate the function codes and test data for the other port drivers 306. The SLC port driver object writes function codes to function-code RAM 318 and writes to write-data RAM 320 that data to be input by the SLC port driver 302 to the hardware under test 304. The SLC port driver object writes expected results data for use with the SLC instruction cache to compare-IC-data RAM 324 and writes expected results data for use with the SLC operand cache to the compare-OC-data RAM 322. The port driver objects 312, 314, and 316 may be viewed as software port drivers and the port driver 302 may be viewed as a hardware port driver since it drives inputs to the hardware under test 304. The log file 330 may be used by the test generator 310 to log test results. It will be appreciated that the other port driver(s) 306 may implement a set of port driver objects different from port driver objects 312 and 314, and the different port driver objects may generate function codes and test data to RAM files different from the types of RAM files 308.

The test generator 310 is an executable program as generated by compiler 332 from the test source file 334 in combination with the test generator class library 336. The test generator class library contains the classes having methods and data structures for the RAM objects 308. For example, the methods support writing of function codes to the function-code RAM 318, mask data to mask RAM 326, and data to data RAM 320. Those skilled in the art will recognize that in other embodiments the test generator may be an interpreted program rather than compiled object code. In addition, any implementation-suitable language may be used for the test source file 334 and test generator class library 336.

Figure 4:
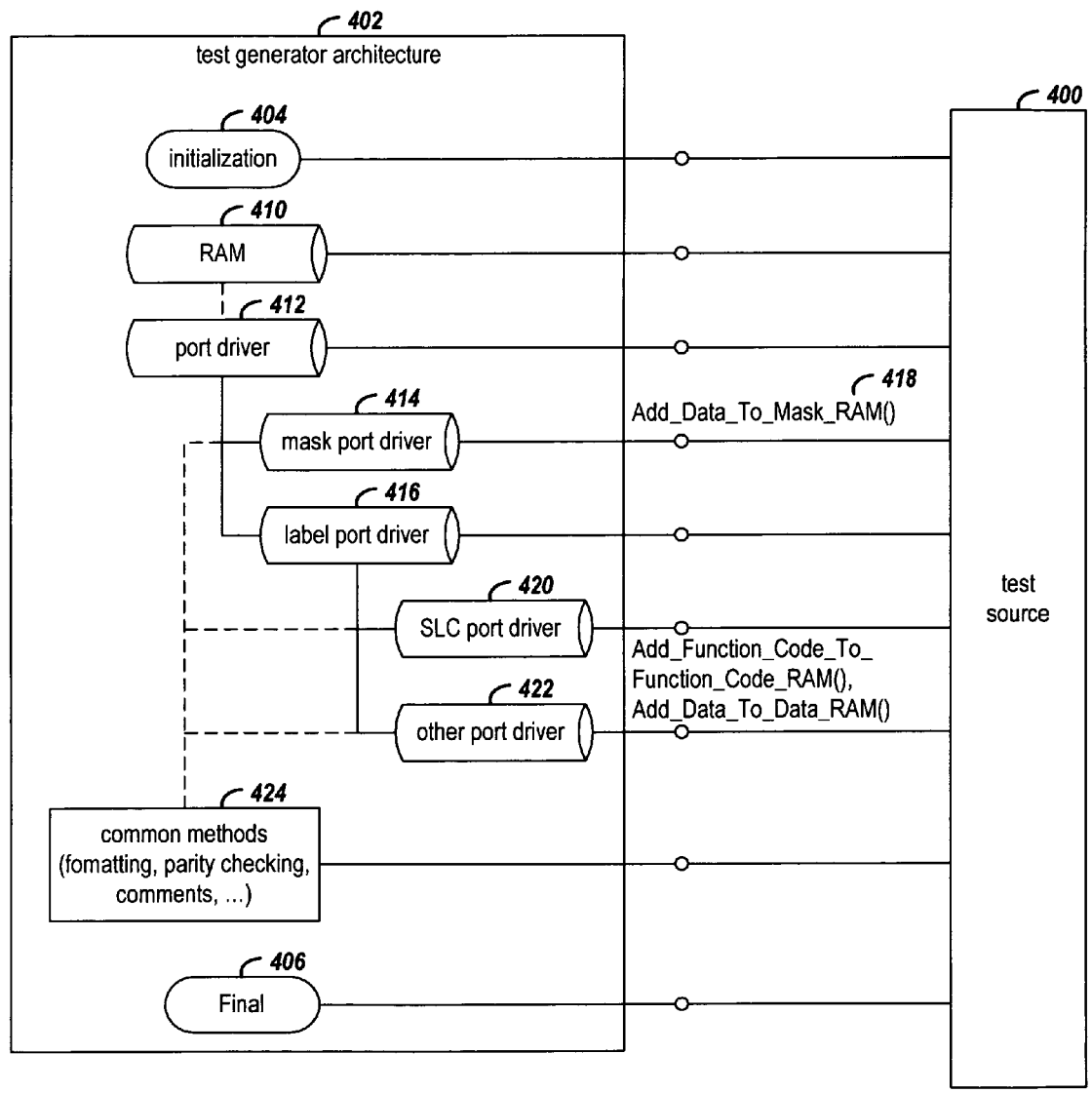
FIG. 4 is a component diagram that illustrates the relationships between the components used to generate test data and method calls made from within a test source to methods provided by objects from the test generator architecture.

FIG. 4 is a component diagram that illustrates the relationships between the components used to generate test data and method calls made from within the test source 400 to methods provided by objects from the test generator architecture 402. The Initialization and final methods 404 and 406 perform initialization and cleanup of common data used by the other components in the architecture, respectively.

The RAM component 410 provides the class for defining a data structure used as one of RAM objects 308 (FIG. 3). The RAM component is associated with a port driver component 412, which has the subcomponents: mask port driver component 414 and label port driver component 416. The mask port driver component has a method, Add_Data_to_Mask_RAM( ) 418, for adding data to a mask RAM object 326. The label port driver component 416 provides methods for defining labels in function-code RAM and methods for transferring control to labels in the function-code RAM. Labels point to positions in the other RAMs 320, 322, 324, and 326 as well as to a position in the function-code RAM. When a jump is performed, the Port Driver 302 must go to the correct address concurrently in all the RAMs because data used in association with the function code at the label position in the function-code RAM is stored in a corresponding label position in the other RAMs.

The SLC port driver component 420 is a subcomponent of the label port driver component 416 and includes the methods used for generating function codes and test data for an SLC design. Similarly, component 422 provides methods for other types of port drivers. For ease of reference in this description, the method for adding function codes to a function RAM is called, Add_Function_Code_to_Function_Code_RAM( ), and the method for adding data to a RAM such as write-data RAM 320 is called, Add_Data_to_Data_RAM( ).

The mask port driver component 414, SLC port driver component 420, and other port driver components 422 include various methods 424 that are commonly used with these components, such as for data formatting, parity checking, and outputting comments.

Figure 5:
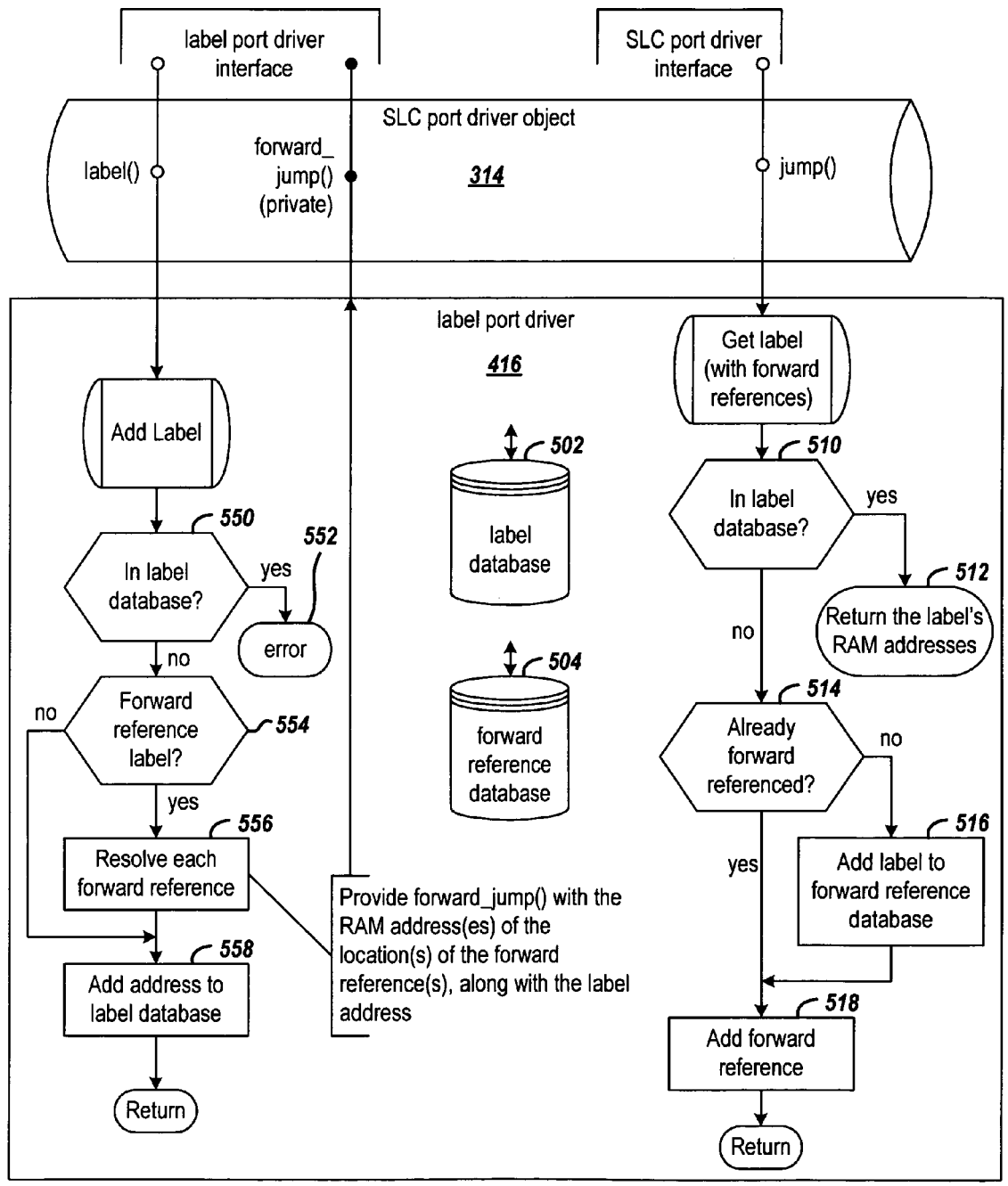
FIG. 5 is a flow diagram of methods called by a port driver object for handling forward jumps to labels, with the methods inherited from the label port driver component and the second level cache (SLC) port driver component, for example.

FIG. 5 is a flow diagram of methods called by a port driver object for handling forward jumps to labels, with the methods inherited from the label port driver component and the SLC port driver component, for example. In FIG. 3, it was described that the function-code RAM object 326 stores function codes that are processed by the SLC port driver 302. It may be beneficial for the "program" within the function-code RAM to perform branches and loops, and labels are used to support such branching and looping.

In one embodiment, a label port driver class is provided to encompass the functionality to support labels. To use the label capabilities, a specific port driver object inherits from the label port driver class. The label port driver class also supports forward referencing of labels. A forward reference to a label is a jump to a label that has not yet been declared in the function-code RAM.

The processing of labels in a port driver object is illustrated by the SLC port driver object 314 in FIG. 5. To explain the processing associated with jumping to an already-declared label and jumping to a not-yet-declared label, the explanation of FIG. 5 first describes a call by the SLC port driver object to the jump( ) method provided by the label port driver 416 via the SLC port driver interface. Generally, the jump( ) method obtains the RAM addresses of the referenced label. If the referenced label is in the label database 502 (decision step 510), the method returns the address of the function-code RAM associated with the label along with any other addresses of others of the RAMs 320, 322, 324, and 326 which may have data to be used in association with the function code stored in the function-code RAM (step 512). The label database 520 stores in association with each label, the addresses in the RAMs 308 to which the label refers. The returned addresses are written in the appropriate ones of RAMs 308 at the locations of the jump instructions. For example, the associated address for the function-code RAM is written to the function-code RAM at the address of the jump instruction, and the associated address for the write-data RAM is written to the write-data RAM at the address of the jump instruction. Writing of the addresses into the RAMs is performed by the inherited SLC Port Driver class object, following the procedures described in FIGS. 6, 7, and 8 (except that instead of writing data or function codes, addresses and a code to indicate jump are written). Otherwise, if the label is not in the label database, the method proceeds to determine whether the label has already been forward referenced and is in the forward reference database (decision step 514).

The forward reference database 504 is used to track references to the label until the address of the label has been resolved (by way of a label declaration in a call to the label( ) method) and the label has been added to the label database. If the label is not yet in the forward reference database, the label is added to the forward reference database (step 516). Stored in association with each label in the forward reference database, are the function-code RAM addresses of forward references to that label. Thus, the forward reference is also stored in the forward reference database (step 518) before returning control to the SLC port driver object.

A call by the SLC port driver object 314 to the label( ) method provided by the label port driver adds a label to the label database. If the label to be added is already in the label database (decision step 550), an error is returned (step 552). Otherwise, the method determines whether there is a forward reference to the label in the forward reference database (decision step 554). The function-code RAM address of each forward reference to the label, as identified in the forward reference database, and the function-code RAM address of the label is provided to the forward_jump ( ) function (step 556). The forward_jump ( ) function writes the label address in the function-code RAM at the addresses indicated by the forward references. The label and associated function-code RAM address are then added to the label database (step 558) before control is returned to the SLC port driver object. In one embodiment, an independent label database is maintained for each port driver object.

The various embodiments of the invention allow port driver objects to be created for any application-specific testing.

Some applications may find that multiple instances of the same port driver object may be useful for simulation. The functions performed by the methods used by the port driver objects generally include adding function codes to a function-code RAM, adding data to a data RAM, and adding data to a mask RAM. FIGS. 6, 7, and 8 generally describe these functions.

FIG. 6 is a flow diagram of an example process for adding function codes to a function-code RAM in accordance with various embodiments of the invention. The process may be generally invoked from a port driver object (as specified in the test source file 334, FIG. 1). An initial step performed by the process is to check that the command parameters and values are valid according to application requirements (step 602).

The particular function code added to the function-code RAM may require corresponding data to be added to one of the data RAMs (e.g., 320, 322, and 324). In one embodiment, a call by a port driver object to a method for writing data to a data RAM may omit the designation of the particular data RAM to be written. This may be accomplished by saving, when the method for adding a function code to the function-code RAM is invoked, state information that indicates to which data RAM, data is to be next written (step 604). The ChooseRAM( ) method, which selects to which data RAM data is to be written, is invoked by the process shown in FIG. 7 for writing data to a data RAM. The specific information that is saved to indicate to the ChooseRAM( ) function which RAM is to be selected in the next add_data call identifies the RAM. For example, a function code for writing to an operand cache results in setting the write-data RAM 320 as the expected RAM. In another example, a function code that specifies reading from the instruction cache results in setting the compare-IC-data RAM as the expected data RAM.

The input parameter values are formatted for a fixed-width data fields (step 606). In one embodiment, each field is a large integer type which manages integer data of arbitrary length. For example, the BigNum capability of Lisp may be similarly implemented in an alternative programming language such as C++. The parameter values are then formatted for user-readable output (step 608). All the parameter values are then combined into a single large integer (a large integer can have an arbitrary length, step 610), and that large integer value is written to the function-code RAM (step 612).

FIG. 7 is a flow diagram of an example function for adding data to a data RAM in accordance with various embodiments of the invention. The particular data RAM to which the data is to be added is selected based on either a parameter value that identifies the data RAM or based on the data saved from a previous call to the Add_Function_Code_To_Function_Code_RAM( ) method (step 702). The process also checks whether the command parameters and values are valid according to application requirements (step 704). Steps 706, 708, 710, and 712 are analogous to steps 606, 608, 610, and 612 of the Add_Function_Code_To_Function_Code_RAM( ) method described in FIG. 6. The data set up by the Add_Function_Code_To_Function_Code_RAM( ) method for selecting a data RAM is then cleared (step 714).

FIG. 8 is a flow diagram of an example function for adding data to a mask RAM in accordance with various embodiments of the invention. A mask RAM stores mask values that are used for comparing output from the hardware under test to expected results data. The Add_Data_To_Mask_RAM( ) method adds a mask value to a mask RAM.

If the mask parameter value is already in the mask RAM (decision step 802), the index to the mask value in the mask RAM is returned to the calling port driver object (step 804). The Add_Data_To_Data_RAM( ) method is also called to add the index value to the designated data RAM (step 806), for example, the compare-OC-data RAM 322 or compare-IC-data RAM 324 of FIG. 3.

If the mask value is not present in the mask RAM (decision step 802), the command parameters and values are checked, set up for fixed-width fields, compacted, and written to the mask RAM (step 808), analogous to steps 602, 606, 608, 610, and 612 of FIG. 6. The index in the mask RAM of the mask value is returned to the port driver object (step 810), and the Add_Data_To_Data_RAM( ) method is also called to add the index value to the designated data RAM (step 806).

The code in Example 1 below illustrates code from an example test source file 334. In the example embodiment of FIG. 3, this code is compiled and executed to generate function codes and data that are stored in the RAM objects 308 and processed by the port driver 302. This code is merely for illustration purposes. Those skilled in the art will recognize that many other alternative code sequences may be utilized instead to implement similar functionality, and thus the following should not be considered limiting in any way.

```
//Copyright Unisys Corporation 2005
#include "PortDriverCompiler/VY2SCPortDriver.h"
#include "PortDriverCompiler/VY2MaskPortDriver.h"
using namespace PortDriver;
using namespace VY2SCFuncCodes;
int main(int argc, char *argv[ ])
{
   Init ("test", "Random Test", argc, argv);
   {
   VY2SCPortDriver SCPD;
   VY2MaskPortDriver MaskPD;
   Comment("PortDriver shared function to print into the
      log");
   //Create some data masks
   int MSK_ALLONES = MaskPD.mr("0777777777777");
   int MSK_ALLZEROS = MaskPD.mr("0000000000000");
   //Perform a write; SCPD.fa_nrm writes to a
   //function-code RAM, and SCPD.data_4 writes to a
   //data RAM
   SCPD.fa_nrm(B8XX,1,21,0);
   SCPD.data_4(5540529,MSK_ALLZEROS,14351950,
      MSK_ALLZEROS,     3115263,MSK_ALLZEROS,
      689997,MSK_ALLZEROS,    3805261,MSK_ALL-
      ZEROS,4495259,MSK_ALLZEROS,     8300521,
      MSK_ALLZEROS,12795780,MSK_ALLZEROS);
   //Perform an OC read and compare the data
   SCPD.fa_nrm(OHBX,1,21,0);
   SCPD.data_4(5540529,MSK_ALLONES,14351950,
      MSK_ALLONES,      3115263,MSK_ALLONES,
      689997,MSK_ALLONES,          3805261,MSK_
      ALLONES,4495259,MSK_ALLONES,    8300521,
      MSK_ALLONES,12795780,MSK_ALLONES);
   //Jump to the end
   SCPD.fa_jmp("EndOfTest");
   SCPD.Label("EndOfTest");
   }
   Final( );
   return 0;
}
```

EXAMPLE 1

The code in Example 2 below illustrates code from an example header file that defines the PortDriver namespace which includes common functions and a RAM object. This code is merely for illustration purposes. Those skilled in the art will recognize that many other alternative code sequences may be utilized instead to implement similar functionality, and thus the following should not be considered limiting in any way.

```
//Copyright Unisys Corporation 2005
#ifndef PORTDRIVER_H
#define PORTDRIVER_H
#pragma warning (disable : 4786)
#include <vector>
#include <string>
#include "../LargeInt/LargeInt.h"
using namespace std;
//*NOTE: Hack to get past bug in GCC 3.2.3
char* operator+(std::streampos &, char *);
// Port Driver Compiler Version
#define PD_REV "5.20"
// max # of ERROR msgs before output terminates
#define MAX_ERRORS 32
// The system command to create a directory.
#define MAKEDIR "mkdir"
//Return value if Ram::Find( ) fails
#define CANT_FIND_DATA (unsigned int)-1
// Output( ) defines.
#define NO_OUTPUT (unsigned int)-1
#define PRINT_ADDR_COL 0
#define PRINT_DATA COL 20
#define PRINT_FUNC_COL 55
#define PRINT_MAX_COL 100 //console output line length
/*----------------------------------------------------------------
    PortDriver namespace This namespace holds the common functions and data for a port driver. Make sure Init( ) has been called before creating an instances of a specific PortDriver class. Call Final( ) after all instances have been destructed to get an error summary.

All the basic required functionality for a port driver is implemented in here, including test initialization, Ram objects, and console output.

All bool functions return true if successful, else false. Errors are printed, but execution continues.
----------------------------------------------------------------*/
namespace PortDriver
{
/* --- Data ---
*/
typedef vector<unsigned int> RamAddressList;
// define Message types
enum MessageEnum {Error, Warning, Info, Direct};
// define odd or even parity types
enum ParityEnum {Even, Odd};
extern string n_sHVLName, //hvl name
    n_sTestName; //Test name (will be used for output
        //folder/file name)
//Place to direct printed output to. Defaults to the console
//window.
extern ostream *n_pCaptureFile;
//The base for printing output
extern LargeInt::BaseEnum n_OutputBase;
extern unsigned int n_Errors; // number of PDC errors
    (current)
extern unsigned int n_Warnings; // number of PDC warnings
extern unsigned int n_Infos; // number of PDC info messages
//
/* ----- Functions -----
 * Parity(Even or Odd, number).
 *
 * Return either a 0 or 1 based on the number of ones and the
     desired
 * parity:
 * Odd: return a 1 if the number of ones is even
 * Even: return a 1 if the number of ones is odd
\***/
unsigned int Parity(ParityEnum, const LargeInt &);
/*******************************************
               ***************************\
 * Compact(Array of numbers, corresponding array of bits
     per number,
 * How many numbers, Return value storage)
 *
 * Converts the array of numbers into a single number
 * 1. Each number in ValueArray[i] represents NumBitsArray[i] bits in the
 * CompactResult. ValueArray[0] is the most significant
     bits, and
 * ValueArray[ArrayLength-1] is the lest significant bits
 * 2. Each number in ValueArray is shifted into place in the
     CompactResult
 * and the final result is returned in Return value storage.
\***/
bool Compact(const LargeInt *, const unsigned int *,
    unsigned int, LargeInt &);
/*******************************************
               *****************\
 * Expand(Array of numbers, corresponding array of bits
     per number,
 * How many numbers, Return value storage, Base for
     printing)
 *
 * Converts the array of numbers into a single string with a
     space in between each number.
 * 1. Each number in ValueArray[i] represents NumBitsArray[i] bits in the CompactResult. ValueArray[0] is the
     least significant bits, and ValueArray[ArrayLength-1] is
     the most significant bits
 * 2. Each number in ValueArray is converted to a string of
     the specified base, and then added to the result string,
     leaving one space in between each number. Zeros are
     printed as to take up the full NumBitsArray[i] bit length.
\***/
```

```
bool Expand(const LargeInt *, const unsigned int *
    unsigned int, string &, LargeInt::BaseEnum);
bool PrettyExpand(const LargeInt *, const unsigned int *,
    unsigned int, string &, LargeInt::BaseEnum, unsigned
    int);
/************************************************
 **************\
 * Output(PortDriver prefix, RAM name, ram address,
   expanded output,
 * function string)
 *
 * 1. starting at column PRINT_ADDR_COL, print the PD
   prefix and RAM name,
 * and copy in the address, unless the address is NO_OUT-
   PUT(−1).
 * PD Prefix is used to identify the calling port driver.
 * Ram name is used to identify the ram written to. THe
   output looks like:
 * PrefixRam[Address] Output function
 * 2. starting at column PRINT_DATA_COL, copy in the
   expanded output
 * 3. starting at column PRINT_FUNC_COL, copy in the
   function string
 * 4. Print the string.
\***/
bool Output(const string &, const string &, unsigned int,
    const string &, const string &);
/************************************************
 *****************\
 * Message(Message type, Message text)
 *
 * 1. create string based on type
 * 2. print error message
 * 3. return true if able to print message, else false
\***/
bool Message(MessageEnum, const string &);
/* ------ Objects -------
*/
/* Ram object
   Ram class holds all the data for one RAM.
   The data is stored in a LargeInt array, and is written to file
       when the Ram is destructed. SYMPRO header verilog in
       sHeaderFileName is put in the output file below
   The time/compiler/test stamp, but above the RAM data
   The data is printed in m_Base with the given prefix/postfix.
*/
class Ram
{
protected:
    //State Variables
    unsigned int m_BitWidth; //The width of this ram in bits
    unsigned int m_MaxAddress; //The largest address
        allowed
    //Data structure Variables
    typedef vector<LargeInt> RamArray;
    RamArray m_RamArray;
public:
    //Default construction will be an unusable RAM (capac-
        ity is
    //0 bits).
    //You must use the overloaded constructor to make the
        ram
    //usable,
    //or use the copy constructor or assignment operator.
    Ram( );
    //Constructor
    //int = the width of this ram in bits
    //int = max size for this ram
    Ram(unsigned int, unsigned int);
    //Writes "LargeInt" into the current Ram address
    //Increments the current Ram address
    //returns true if successful, else false
    virtual bool Write(const LargeInt &);
    virtual Ram &operator+=(const LargeInt &);
    //Writes "LargeInt" into the RAM at address "unsigned
        int"
    //You can only write to a RAM location that was already
    //written to once through Write(LargeInt)
    //returns true if successful, else false
    virtual bool Write(const LargeInt &, unsigned int);
    virtual LargeInt &operator[ ](unsigned int);
    //Finds the address of the first occurrance of data
    //LargeInt"
    //Returns CANT_FIND_DATA if it could not be found.
    virtual unsigned int Find(const LargeInt &) const;
    //Retrieves the current address of the ram. This is the
    //address that the next Write will write to.
    virtual unsigned int Address( ) const;
    //Writes the RAM file.
    //string = file name for this ram
    //string = header data (for dynamically generated header
    //data)
    //string = file name for file with header data for this ram
    // (for static header data)
    //BaseEnum = base to output in
    //string = prefix for the output number (ie, verilog 4" for
    //base Hex)
    //string = postfix for the output number (ie, verilog ")
    //Dynamic header string goes at the top, followed by
    //SYMPRO header data from header file. Then the RAM
    //vectors, preceeded by address number.
    virtual bool WriteFile(const string &, const string &,
        const string &, LargeInt::BaseEnum, const string &,
        const string &) const;
    //Destructor. Only declared so we can make it virtual
    virtual ~Ram( )
    { }
};
/* ------ Commands ------
    Init(Test Name, HVL name, command line params argc,
        argv)
 *
 * Reset PortDriver data such as number of errors and the
 * capture file
 * Store test name, hvl name, and print a starting banner
 * Parse command line options (case insensitive).
 * -c "filename" is the capture file to direct printed output
 * to.
 * -h -x -d -o -b prints ram word output in hex/dec/oct/bin
 *
 * Return true if successful, else false
*/
bool Init(const string &, const string &, int, char *[ ]);
/************************************************
 ***********************\
Comment( )
 *
 * Algorithm:
1. Output the text string input
\***/
bool Comment(const string &);
```

```
/****************************************
 *********************\
 * Command: Final( )
 *
 * Prints an error summary
 * Final should undo anything done in Init, like delete cap-
     ture file.
\***/
bool Final( );
};
#endif
```

EXAMPLE 2

The code in Example 3 below illustrates code from an example header file that defines the mask port driver class. This code is merely for illustration purposes. Those skilled in the art will recognize that many other alternative code sequences may be utilized instead to implement similar functionality, and thus the following should not be considered limiting in any way.

```
//Copyright Unisys Corporation 2005
#ifndef VY2MASKPORTDRIVER_H
#define VY2MASKPORTDRIVER_H
#include "PortDriver.h"
#include "../LargeInt/LargeInt.h"
using namespace std;
using namespace PortDriver;
/*
    MaskRam class
    Uses the PortDriver namespace.
    Use LargeInts instead of ints for any parameters that may
        be greater than 32 bits. Functions should return bool true
        if successful, else bool false.
*/
class VY2MaskPortDriver
{
protected:
/* --- Data ---
*/
protected:
    // next active Mask Port Driver Number
    static unsigned int m_NextVY2MaskPortDriverID;
    //Identifier number for the port driver
    unsigned int m_PortDriverID;
    //Identifies outputs from this port driver instance
    string m_OutputPrefix;
    Ram m_Ram;
/* - Functions-
*/
    //None
/* - Objects -
*/
    //None
public:
/* - Commands -
*/
    VY2MaskPortDriver( );
    VY2MaskPortDriver(const VY2MaskPortDriver &);
    VY2MaskPortDriver            &operator=(const
        VY2MaskPortDriver &);
    virtual ~VY2MaskPortDriver( );
/****************************************
 ******************\
 * mr(bit mask)
 *
 * Algorithm:
 * 1. See if the mask is already in the RAM
 * 2. If a match is found, return that address
 * 3. otherwise, add the mask to the mask RAM and
     return that address.
\***/
    virtual unsigned int mr(const LargeInt &);
#endif
```

EXAMPLE 3

The code in Example 4 below illustrates code from an example header file that defines abstract virtual base class for label port driver objects. This code is merely for illustration purposes. Those skilled in the art will recognize that many other alternative code sequences may be utilized instead to implement similar functionality, and thus the following should not be considered limiting in any way.

```
//Copyright Unisys Corporation 2005
#ifndef LABELPORTDRIVER_H
#define LABELPORTDRIVER_H
#include "PortDriver.h"
#pragma warning (disable : 4786)
#include <vector>
#include <map>
#include <list>
#include <string>
using namespace std;
using namespace PortDriver;
/*
    LabelPortDriver class
    Uses PortDriver namespace: see PortDriver information.
    This is the abstract base class for a generic port driver with
        labels. You cannot instantiate this class, you must inherit
        a new class which implements a specific port driver, and
        instantiate from that. The inherited class must imple-
        ment the ForwardJump( ) and Label( ) functions.
    All the basic required functionality for a port driver with
        labels is implemented in this class. It internally takes
        care of forward referenced labels.
*/
class LabelPortDriver
{
protected:
/* --- Data ---
*/
```

```
//SLabel is a structure to hold a single
//label's address data and name. Whenever a new label is
//defined, a new SLabel is added to the database. The data-
   base is
//a map from label name to label data.
struct SLabel
}
   SLabel(const RamAddressList &Addresses)
      : m_Addresses(Addresses)
      { }
   RamAddressList m_Addresses;
};
typedef map<string, SLabel> LabelMap;
LabelMap m_LabelMap;
//The ForwardLabel database is a map from label name to
//reference list. The reference list is a list of
//SForwardReference  structures.  SForwardReference
   holds the index
//into the Rams for instructions that tried to forward jump
   to
//this label, as well as the function code for the specific
//instruction. When the forward label is finally encoun-
   tered,
//all these instructions in the instruction ram will be
   updated
//to point to the correct addresses.
struct SForwardReference
{
   SForwardReference(const RamAddressList &RamAd-
      drs, unsigned int Code)
      RamAddresses(RamAddrs), FunctionCode(Code)
      { }
   RamAddressList RamAddresses;
   unsigned int FunctionCode;
};
typedef list<SForwardReference> ReferenceList;
typedef map<string, ReferenceList> ForwardLabelMap;
ForwardLabelMap m_ForwardLabelMap;

/* - Functions-
*/
//PutLabel(name, RamAddressArray[NumRams])
//Adds the label and the array of addresses to the internal
   map.
//If the label already exists, it prints an error and returns
//false.
//If the label is in the ForwardLabel database, it updates all
//the instructions that jumped to it by calling ForwardJump,
   adds
// the label to the regular label database, and returns true.
//If label wasn't in either database, it adds it to the regular
// labelmap and returns true.
bool AddLabel(const string &, const RamAddressList &);
//GetLabel(name, RamAddressArray[NumRams])
//looks for a matching name in the internal label map.
// If the label is found, then write the ram address data into
// RamAddressArray
// else write zeros and return false.
bool GetLabel(const string &, RamAddressList &) const;
//GetLabel(name, RamAddressArray[NumRams],
// InstructionRamAddresses[NumRams], Function Code)
//looks for a matching name in the internal label map.
// If the label is found, write the address data into
// RamAddressArray.
// Otherwise, if it's in the ForwardLabel database,
// add the instruction's ram address list to the label's
// reference list
// If the label wasn't found, add it to the Forward label
// database,
// and add the current instruction's ram addresses to
// it's reference list.
// If the label wasn't in the Label database,
// write zeros to the RamAddressArray, and return false.
bool GetLabel(const string &, RamAddressList &, const
   RamAddressList &, unsigned int);
//PrintForwardLabels(Name by which to identify the port
   driver)
//Prints a summary of all the forward
//referenced labels which have yet to be defined.
bool PrintForwardLabels(const string &) const;
/***************************************
   ******************\
   *       ForwardJump(InstructionRamAddresses[Num-
      Rams], Function Code, name, AddressArray[Num-
      Rams])
   *
   * This is an abstract virtual function.
   * It is the inherited class's duty to implement this func-
      tion
   * to take care of updating the instruction at
   * InstrRamAddresses with the forward jump. This func-
      tion is
   * called from within AddLabel, and shouldn't be called
      from
   * anywhere else.
   * Function code is an additional parameter to identify
      which
   * kind of jump the instruction was.
   */
   virtual bool Forwardjump(const RamAddressList &,
      unsigned int, const string &, const RamAddressList &)
      = 0;
public:
/* - Commands -
*/
   /***************************************
      ******************\
      * Label(name)
      *
      * Store the label and associated ram addresses in the
         label
      * map by calling AddLabel( ).
      * Print expanded address data
      * The inherited class must implement this function.
   \***/
   virtual bool Label(const string &) = 0;
};
#endif
```

EXAMPLE 4

The code in Example 5 below illustrates code from an example test generator class library 336. This code is merely for illustration purposes. Those skilled in the art will recognize that many other alternative code sequences may be utilized instead to implement similar functionality, and thus the following should not be considered limiting in any way.

//Copyright Unisys Corporation 2005
ifndef VY2SCPORTDRIVER_H
define VY2SCPORTDRIVER_H

```
#include "LabelPortDriver.h"
#include "VY2SCFuncCodes.h"
#include "../AddressConverter/AddressConverter.h"
#include <string>
#include "../LargeInt/LargeInt.h"
using namespace std;
using namespace PortDriver;
using namespace VY2SCFuncCodes;
// number of rams for the SC PD.
#define NUM_VY2SC_RAMS 4u
// maximum number of IP Port Drivers
#define VY2SC_MAX_IP_NUM 8u
/*
   VY2SCPortDriver
   An instance of this class is one Voyager 2 SC port driver
      object. This particular version is for emulating an IP to
      drive the ports on the second level cache.
   Make sure PortDriver::Init( ) has been called before creat-
      ing an instance.
   Call SCPortDriver::Final( ) after all
   instances have been destructed to get an error summary.
   Each instance gives itself a sequential ID. So if you create
      VY2SCPortDriver SCPD[8], AnotherSCPD;
   then SCPD[0] has ID 0 and SCPD[7] has ID 7, and
      AnotherSCPD has ID 8.
   All files will be written when the instance destructs.
   The final Halt instruction will also be added at destruction.
   All the SC function codes are located in
      VY2SCFuncCodes.h
   Functions use Ashley Wise's LargeInt datatype library to
      emulate the >32 bit registers on the 2200 mainframe and
      the simulation environment RAMs.
   All bool functions return true if successful, else false.
   Errors are printed, but execution continues.
*/
class VY2SCPortDriver : public LabelPortDriver
}
protected:
/* --- Data ---
*/
public:
   // define RAM name synonyms
   enum RamEnum {FA, DR, DW, DRI};
protected:
   //This is for Ram mnemonics when printing ram output
      static const char * const m_sRamName
      [NUM_VY2SC_RAMS];
   // DataState states.
   enum DataStateEnum {DataNone, Data1, Data4};
   //This is for data state mnemonics when printing Ram
      output static const char * const m_sDataName[3];
   // next active SC Port Driver Number static unsigned int
      m_NextVY2SCPortDriverID;
   //Identifier number for the port driver unsigned int m_Port-
      DriverID;
   //Identifies outputs from this port driver instance string
      m_sOutputPrefix;
   //Keeps track of how many Halt Jumps this port driver has
   //If different port drivers get out of sync with Halt Jumps,
   //then errors will be printed.
   unsigned int m_NumHaltjumps;
   // UPI Message Counting
   // Each PD needs a count for the number of direct and
      broadcasted
   // UPI messages it gets. Store here.
   unsigned int m_NumBrdcstUPI;
   unsigned int m_NumDirUPI;
   // ENZ read w/lock enforcement
   bool m_CheckLock;
   // Make sure a lock release is issued only if a lock is
      pending.
   bool m_PendingLock;
   //m_DataState is indexed via RamEnum.
   //Each Ram has an associated state which represents how
      many
   //lines of data it is expecting. Set/Update/CheckDataState
      use
   //this.
   DataStateEnum m_DataState [NUM_VY2SC_RAMS];
   Ram m_Ram[NUM_VY2SC_RAMS];
/* - Functions-
   Halt( )
 *
 * 1. Checks the state of the RAMs it will write to
 * 2. Creates the RAM data entry for a halt jump as per the
 * specs
 * 4. Outputs expanded version of the data
 * 5. Writes data to RAM object
 * 6. Sets the new state of the RAM
*/
   virtual bool Halt( );
   /*
      ForwardJump(InstructionRamAddresses[NumRams],
         Function Code, name, AddressArray [NumRams])
    *
    * This is an abstract virtual function.
    * It is the inherited class's duty to implement this func-
      tion
    * to take care of updating the instruction at
    * InstrRamAddresses with the forward
    * jump. This function is called from within AddLabel,
      and
    * shouldn't be called from anywhere else.
    * Function code is an additional parameter to identify
      which
    * kind of jump the instruction was.
   */
   virtual bool Forwardjump(const RamAddressList &,
      unsigned int, const string &,const RamAddressList &);
/*******************************************
************\
 * SetDataState(RamType, NewValue)
 *
 * Resets the Ram requirements for a new command.
 *
 * Checks for a DataNone value of DataState for ram
      RamType, which
 * indicates that the ram data and functions are in synch.
 * Returns true if the zero value was found, else false.
 * Changes the DataState value for RamType to be
      NewValue
\***/
```

```
virtual bool SetDataState(RamEnum, DataStateEnum =
    DataNone);
/************************************************
 ***************\
 * UpdateDataState(RamType, UpdateValue)
 *
 * Lets the Ram state know that data has been written to
     Ram
 * RamType.
 *
 * Updates the value of DataState for ram RamType
     based on
 * UpdateValue.
 * Prints an error if the wrong amount of data was written,
 * and
\***/
virtual bool UpdateDataState(RamEnum, DataStateE-
    num);
/*********************************************
 *******************\
 * ChooseRam(DataStateEnum)
 *
 * 1. Searches the rams states and returns the first ram
     who's
 * state equals the parameter. If there is more than one
     Ram
 * with the given state, it prints an error message and
 * returns −1.
 * 2. If there are no Rams with a matching state, it prints
     an
 * error message and returns −1
 * 3. If ChooseRam returns −1, then data_xxx(RamType
     = −1)
 * will return without writing to a ram.
\***/
virtual RamEnum ChooseRam(DataStateEnum) const;
/* -- Objects -
*/
public:
/* - Commands -
*/
/ *******************************************
 *******************\
 * Constructor.
 *
 * Initializes RAMs, ID number, and adds the initial jump
 * instructions.
\***/
VY2SCPortDriver( );
//We have to intervene on making copies, because we want
    each
//instance of a port driver to have a unique ID number, and
    the
//OutputPrefix and Ram filenames are dependent upon this
    ID
//number.
//Copy constructor
VY2SCPortDriver(const VY2SCPortDriver &);
//Assignment operator
//Instance retains it's old ID number.
VY2SCPortDriver &operator=(const VY2SCPortDriver
    &);
/***********************************************
 ****************\
 * Destructor.
 *
 * Writes final Halt instruction.
 * Checks for undefined forward labels.
 * RAM contents are written to file at destruction.
\***/
virtual ~VY2SCPortDriver( );
/***********************************************
 *************\
 * Label(name)
 *
 * Store the label and associated ram addresses in the
     label
 * map by calling AddLabel( ).
 * Print expanded address data
\***/
virtual bool Label(const string &);
/**********************************************
 *******************\
 * fa_xxx
 *
 * 1. Sets the state of the RAMs it will write to based on
 * function code so the Rams know how much data to
     expect.
 * Errors will be printed
 * if a previous data requirement was never met.
 * 2. Checks the validity of it's parameters
 * 3. Creates the RAM data entry as per the specs
 * 4. Outputs expanded version of the data
 * 5. Writes data to RAM object
\***/
virtual bool fa_nop( );
virtual bool fa_nrm(SCCodeEnum, unsigned int, unsigned
    int, unsigned int);
virtual bool fa_bkg(SCCodeEnum, unsigned int, unsigned
    int, unsigned int);
virtual bool fa_wstk(SCCodeEnum, unsigned int,
    unsigned int, unsigned int);
virtual bool fa_commio(SCCodeEnum, unsigned int,
    unsigned int, unsigned int, ByteEnableEnum, unsigned
    int);
virtual bool fa_commio(SCCodeEnum, unsigned int,
    ByteEnableEnum, unsigned int);
virtual bool fa_lfij(unsigned int, unsigned int, unsigned int,
    unsigned int, unsigned int, unsigned int);
virtual bool fa_ctrl(const LargeInt &);
virtual bool fa_upis(unsigned int, unsigned int, unsigned
    int, unsigned int, UPISCodeEnum, unsigned int,
    unsigned int);
virtual bool fa_upis(unsigned int, unsigned int, unsigned
    int, unsigned int, UPISCodeEnum, unsigned int,
    unsigned int, unsigned int, unsigned int);
virtual bool fa_upir(UPIRCodeEnum, unsigned int,
    unsigned int, unsigned int);
virtual bool fa_upir(UPIRCodeEnum, unsigned int);
virtual bool fa_jmp(const string &);
// fa_hjmp also increments the internal Halt Jump counter.
virtual bool fa_hjmp( );
// fa_loop does not allow forward referenced labels
virtual bool fa_loop(const string &, unsigned int);
virtual bool pd_UPIRCountInc(UPIRCodeEnum);
virtual bool pd_UPIRCountInc(UPIRCodeEnum, int);
/***********************************************
 *****************\
 * data_xxx(RamType, Word0, Mask0 [, Word 1,
     Mask 1 . . . ])
 *
```

```
* 1. Returns false if RamType is not a valid ram number.
* 2. Checks the size of it's parameters.
* 3. Creates the RAM data for xxx RAM entries. Each
   entry
* uses two words and two mask address (one mask for
   each
* word.
* 4. Outputs expanded version of the data
* 5. Writes data to RAM RamType
* 6. Updates the state of RAM RamType. Errors are
   printed if
* the wrong number of words are written.
\***/
virtual bool data_ditto(RamEnum, const LargeInt &,
   unsigned int);
virtual bool data_1(RamEnum, const LargeInt &,
   unsigned int, const LargeInt &, unsigned int);
virtual bool data_4(RamEnum,
   const LargeInt &, unsigned int, const LargeInt &,
      unsigned int,
   const LargeInt &, unsigned int, const LargeInt &,
      unsigned int,
   const LargeInt &, unsigned int, const LargeInt &,
      unsigned int,
   const LargeInt &, unsigned int, const LargeInt &,
      unsigned int);
/***********************************************
******************\
* data_xxx(Word0, Mask0 [, Word 1, Mask 1 . . . ])
*
* 1. Makes an educated guess about which Ram should
   be
* written to next
* by calling ChooseRam( )
* 2. Calls the corresponding data_xxx(RamType, . . . )
   function.
\***/
virtual bool data_ditto(const LargeInt &, unsigned int);
virtual bool data_1(const LargeInt &, unsigned int, const
   LargeInt &, unsigned int);
virtual bool data_4(
   const LargeInt &, unsigned int, const LargeInt &,
      unsigned int,
   const LargeInt &, unsigned int, const LargeInt &,
      unsigned int,
   const LargeInt &, unsigned int, const LargeInt &,
      unsigned int,
   const LargeInt &, unsigned int, const LargeInt &,
      unsigned int);
//Macro functions for alternate command name scheme.
#define dr_0(W0, M0, W1, M1)\
   data_1(VY2SCPortDriver::DR, W0, M0, W1, M1)
#define dr_4 (W0, M0, W1, M1, W2, M2, W3, M3, W4, M4,
   W5, M5, W6, M6, W7, M7)\
   data_4 (VY2SCPortDriver::DR, W0, M0, W1, M1, W2,
      M2, W3, M3, W4, M4, W5, M5, W6, M6, W7, M7)
#define dr_ditto(W0, M0)\
   data_ditto(VY2SCPortDriver::DR, W0, M0)
#define dw_ditto(W0)\
   data_ditto(VY2SCPortDriver::DW, W0, 0)
#define dw_1(W0, W1)\
   data_1(VY2SCPortDriver::DW, W0, 0, W1, 0)
#define dw_4(W0, W1, W2, W3, W4, W5, W6, W7)\
   data_4(VY2SCPortDriver::DW, W0, 0, W1, 0, W2, 0, W3,
      0, W4, 0, W5, 0, W6, 0, W7, 0)
#define dri_4(W0, M0, W1, M1, W2, M2, W3, M3, W4, M4,
   W5, M5, W6, M6, W7, M7)\
   data_4(VY2SCPortDriver::DRI, W0, M0, W1, M1, W2,
      M2, W3, M3, W4, M4, W5, M5, W6, M6, W7, M7)
};
#endif
```

EXAMPLE 5

Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

In addition to the embodiments of the invention described above, other aspects and embodiments will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for generating input data to a hardware driver that drives inputs of a simulated electronic circuit design, comprising:
   generating a test generator program from a main program that uses a test generator class library, wherein the test generator class library includes a software driver class corresponding to the hardware driver, and the software driver class includes a storage class corresponding to each memory within the hardware driver, a first set including at least one method for writing function codes to a first object of the storage class, and a second set including at least one method for writing data to a second object of the storage class;
   writing function codes to the first object of the storage class in response to a call by the test generator program to a method in the first set, wherein a function code is decodable by the hardware driver and designates an operation for performance by the driver; and
   writing data of a first type to the second object of the storage class in response to a call by the test generator program to a method in the second set, wherein the data of the first type is data provided by the driver as input to the simulated circuit design.

2. The method of claim 1, further comprising writing data of a second type to a third object of the storage class in response to a call by the test generator program to a method in the second set, wherein data of the second type is mask data for masking data received by the hardware driver from the simulated electronic circuit design.

3. The method of claim 2, further comprising writing data of a third type to a fourth object of the storage class in response to a call by the test generator program to a method in the second set, wherein data of the third type is data for comparison to data received by the hardware driver from the simulated electronic circuit design.

4. The method of claim 3, further comprising for each call to a method in the second set for writing data of the second type to the third object of the storage class, writing an index value in the fourth object of the storage class, wherein the index value references mask data in the third object of the storage class.

5. The method of claim 2, further comprising:
   writing a first set of data of a third type to a fourth object of the storage class in response to a call by the test generator program to a method in the second set, wherein the first set of data of the third type is data for comparison provided to the hardware driver from a first component of the simulated electronic circuit design; and writing a second set of data of the third type to a fifth object of the storage class in response to a call by the test generator program to a method in the second set, wherein the second set of data of the third type is data for comparison provided to the hardware driver from a second component of the simulated electronic circuit design.

6. The method of claim 5, further comprising writing data of the third type to a fourth object of the storage class in response to a call by the test generator program to a method in the second set, wherein data of the third type is data for comparison to data received by the hardware driver from the simulated electronic circuit design.

7. The method of claim 6, further comprising for each call to a method in the second set for writing data of the second type to the third object of the storage class, writing an index value in the fourth object of the storage class, wherein the index value references mask data in the third object of the storage class.

8. The method of claim 1, wherein the first object of the storage class is accessible by address, and the function codes include a jump function code that directs the hardware driver to read a function code at an address of the first object.

9. The method of claim 8, further comprising:

adding to a first database a label name and associated address in the first object of the storage class, in response to a call by the test generator program to a label method of the software driver class, wherein the call to the label method specifies the label name; and writing to the first object of the storage class a first jump function code in combination with an address associated with a first label name in the first database in response to a first call by the test generator program to a jump method of the software driver class, wherein the first call to the jump method specifies the first label name.

10. The method of claim 9, further comprising:

in response to a second call by the test generator program to the jump method, wherein the second call to the jump method specifies a second label name that is not in the first database, adding to a second database the second label name and an associated address of a second jump function code in the first object of the storage class, and writing the second jump function code to the first object of the storage class; and in response to a call by the test generator program that specifies the second label to the label method, writing an address of the second label in the first object of the storage class in combination with the second jump function code, to the first object of the storage class at the address associated with the second label name in the second database.

11. The method of claim 1, wherein the data stored in the first and second objects of the storage class are integers of arbitrary length.

12. A system for generating input data to a hardware driver that drives inputs of a simulated electronic circuit design, comprising:

means for translating a programmatic specification of functions for performance by the hardware driver into function codes input to the hardware driver;

means for translating a programmatic specification of input data for the hardware driver into a first format recognized by the hardware driver;

means for translating a programmatic specification of mask values into a second format recognized by the hardware driver;

means for storing the function codes;

means for storing the input data of the first format; and means for storing the mask values in the second format.

* * * * *